US011264306B2

(12) United States Patent
Sikka et al.

(10) Patent No.: US 11,264,306 B2
(45) Date of Patent: Mar. 1, 2022

(54) HYBRID TIMS FOR ELECTRONIC PACKAGE COOLING

(71) Applicant: International Business Machines Corporation, Armonk, NY (US)

(72) Inventors: Kamal K. Sikka, Poughkeepsie, NY (US); Piyas Bal Chowdhury, Mountain View, CA (US); James J. Kelly, Schenectady, NY (US); Jeffrey Allen Zitz, Poughkeepsie, NY (US); Sushumna Iruvanti, Wappingers Falls, NY (US); Shidong Li, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 16/586,843

(22) Filed: Sep. 27, 2019

(65) Prior Publication Data

US 2021/0098334 A1    Apr. 1, 2021

(51) Int. Cl.
*H01L 23/42* (2006.01)
*H01L 23/373* (2006.01)
(Continued)

(52) U.S. Cl.
CPC .......... *H01L 23/42* (2013.01); *H01L 21/4825* (2013.01); *H01L 21/76828* (2013.01); *H01L 23/3736* (2013.01)

(58) Field of Classification Search
None
See application file for complete search history.

(56) References Cited

U.S. PATENT DOCUMENTS 5,757,620 A * 5/1998 Edwards .................. H01L 23/42
165/185
6,292,369 B1 * 9/2001 Daves ..................... H01L 21/50
361/719

(Continued)

FOREIGN PATENT DOCUMENTS

WO    WO03007312    1/2003

OTHER PUBLICATIONS

Mathias Ekpu, Raj Bhatti, Ndy Ekere, Sabuj Mallik, Kenny Otiaba Manufacturing Engineering Research Group, School of Engineering, University of Greenwich at Medway, Chatham, ME4 4TB, Kent, UK.; "Effects of Thermal Interface Materials (Solders) on Thermal Performance of a Microelectronic Package"; DTIP, Apr. 25-27, 2012, Cannes, France.

*Primary Examiner* — Robert K Carpenter
(74) *Attorney, Agent, or Firm* — Daniel P. Morris; Lou Percello, Attorney, PLLC (57) ABSTRACT

Structural combinations of TIMs and methods of combining these TIMs in semiconductor packages are disclosed. An embodiment forms the structures by selectively metallizing a backside of a semiconductor chip (chip) on chip hot spots, placing a higher performance thermal interface material (TIM) on the metallized hot spots, selectively metalizing an underside of a lid in one or more metalized lid locations, and assembling a lid over the backside of the chip to create an assembly so that metalized lid locations are in contact with the higher performance TIMs. A lower performance TIM fills the region surrounding the higher performance TIM on the underside of the lid enclosing the chips. Disclosed are methods of disposing both solid and dispensable TIMs, curing and not curing the thermal interface, and structures to keep the TIMs in place while assembly the package and compressing dispensable TIMs. Alternative method steps are disclosed, such as: injecting the lower performance TIM through injection holes in a pre-assembled assembly, using solid preform TIMs with cutouts, and using high performance TIM structures that have collapsible rails to prevent lower performance TIM from spilling onto the surface of the higher performance TIM to permit good/bonding.

20 Claims, 11 Drawing Sheets

(51) Int. Cl.
  *H01L 21/48* (2006.01)
  *H01L 21/768* (2006.01)

(56) References Cited

U.S. PATENT DOCUMENTS

| | | | |
|---|---|---|---|
| 7,014,093 B2 | 3/2006 | Houle et al. | |
| 7,468,886 B2* | 12/2008 | Coico | H01L 21/4871 |
| | | | 361/711 |
| 8,232,636 B2* | 7/2012 | Humenik | H01L 23/42 |
| | | | 257/707 |
| 8,970,029 B2 | 3/2015 | Lin et al. | |
| 9,017,808 B2 | 4/2015 | Wang et al. | |
| 9,247,686 B2 | 1/2016 | Jayaraman et al. | |
| 2004/0164402 A1* | 8/2004 | Yoshimura | H01L 23/3677 |
| | | | 257/706 |
| 2006/0060952 A1* | 3/2006 | Yuan | H01L 23/36 |
| | | | 257/675 |
| 2008/0013281 A1* | 1/2008 | Ouyang | H01L 23/3732 |
| | | | 361/707 |
| 2008/0160330 A1 | 7/2008 | Song et al. | |
| 2014/0061893 A1 | 3/2014 | Saeidi et al. | |
| 2017/0200667 A1* | 7/2017 | John | C09D 183/04 |
| 2020/0227336 A1* | 7/2020 | Eid | H01L 23/42 |
| 2020/0373220 A1* | 11/2020 | Chan Arguedas | H01L 23/3675 |

* cited by examiner

HYBRID TIMS FOR ELECTRONIC PACKAGE COOLING

BACKGROUND

The present invention relates to cooling microelectronic devices, circuitry, and packages. More specifically, the invention relates to cooling microelectronics with improved heat conductive thermal interface material (TIM) combinations, structures, and methods.

Heat density increases with circuitry scaling to smaller and smaller dimensions, e.g. heat generated per unit area of semiconductor chips (chips) increases as circuitry scales smaller. Packages of microelectronic circuitry include heat generating chips, connections between microelectronic chips, external connections, heat dissipation devices (e.g. heat sinks and/or lids), sealing components, etc.

Heat dissipation and heat removal from packages becomes more difficult as heat density increases and the surface area of the chips and packages decreases. If heat is not removed effectively, temperatures within the package, chips, and other package components increase. As temperatures increase, the chips and other circuitry in the package become more vulnerable to operating failure and permanent damage. This problem is aggravated in local regions of the chips that generate more heat and have higher temperatures than the rest of the chip, e.g. chip hot spots.

In electronic packages a heat conductive thermal interface material (TIM) is disposed between the heat generating components, e.g., chips, and heat removal devices like heat sinks/lids. TIM is also disposed between other components on a path where heat is flowing. The TIM fills the interfaces between the hard surfaces in physical contact to improve heat conductivity between these surfaces. In some embodiments the TIM material is a polymer grease or a gel that is cured during package assembly. Some TIMs are compressible pads and some TIMs are metals such as Indium.

Generally, polymer TIMs do not perform as well as metal TIMs. However, metal TIMs require more complex assembly and may not be as reliable as polymer TIMs over package operating life.

The prior art uses multiple different TIMs in combination to balance performance and reliability objectives. These combinations also have difficulty performing well.

Some combinations of different polymers do not mix well and don't maintain required positions during package assembly.

TIM combinations of solder and polymers have problems with the polymer spilling over the solder when the solder is heated during package assembly. The spill over adversely affects the bond line during package assembly.

TIM combinations using solder and gap pads also have difficulty maintaining correct bond lines.

There is a need for new TIM designs and structures and TIM use methods to remove heat effectively from chips. Particularly there is a need to improve heat removal from hot spots on chips during semiconductor package operation while maintaining package reliability.

SUMMARY

Embodiments of the present invention include structural combinations of TIMs and methods of combining these TIMs to gain the advantages of using both higher performance TIMs and lower performance TIMs together for heat removal in semiconductor packaging.

An embodiment of forming one or more thermal interfaces in a semiconductor package comprises the steps of selectively metallizing a backside of a semiconductor chip (chip) to form one or more metallized regions on the backside of the chip. A higher performance thermal interface material (TIM) is placed on the metallized regions of the chip. An underside of a lid is selectively metallized at locations corresponding to the metallized regions on the chip. The lid is assembled over the backside of the chip to create an assembly so that metalized lid locations are in contact with the respective higher performance TIMs. In some embodiments, the TIMs are cured and/or re-flowed. A lower performance TIM fills the region surrounding the higher performance TIM on the underside of the lid enclosing the chips. Various methods of creating these structures are disclosed.

BRIEF DESCRIPTION OF THE DRAWINGS

Various embodiments of the present invention will be described below in more detail, with reference to the accompanying drawings, briefly described below. The Figures show various structures and related method steps of the present invention.

DETAILED DESCRIPTION

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, servers (including in data centers), personal computers and gaming devices, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "tight", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Referring now to the Figures.

Figure 1:
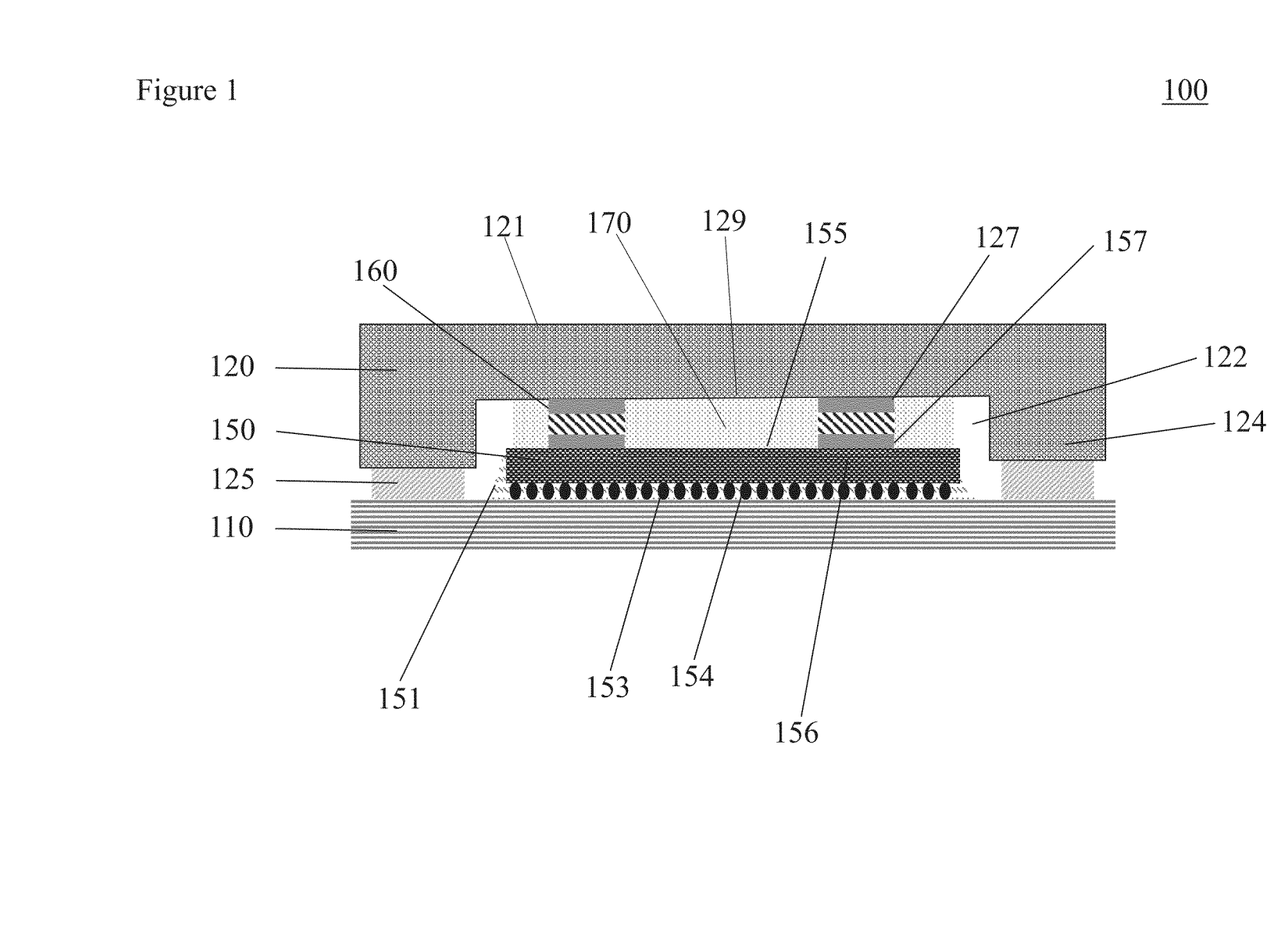
FIG. 1 is a cross sectional view of a semiconductor package using a combination of TIMs to conduct heat away from semiconductor chips.

FIG. 1 is a cross sectional view of a flip-chip semiconductor package (package) 100 using a combination of TIMs (160, 170) to conduct heat away from semiconductor chips (chips) 150.

The package 100 comprises a chip carrier 110. The chip carrier 110 can be made of a laminated organic or ceramic, or other known material. The chip carrier 110 provides support for the components of the package 100 and includes interconnections and/or other circuitry within the laminated layers.

One or more chips 150 are disposed on the chip carrier 110. The chips 150 have a connection side 154 with one or more external connections 153 and a backside 155. Typically, the connections 153 on the connection side 154 connect to connections on the chip carrier 110. However, in some embodiments, connections 153 can be on the backside 155, e.g. for wire bond connections and/or chip 110 stacking. The backside 155 is the side of the chip 150 opposite the chip carrier 110. Examples of external electrical (and physical) connections (connections) 153 are C4 bonds.

In some embodiments there is an underfill 151 material disposed between the connection side 154 and chip carrier 110. The underfill 155 fills the space between the chip 150 and the chip carrier 110 and increases the operating life of the interconnects 153.

Packages containing chip carriers 110, chips 150, connections 153, and underfill 151 are known.

During operation, some parts of the chip 150, called chip 150 hot spots 156, produce more heat, and become hotter, than other parts of the chip 150.

A lid 120 is a structure with relatively large thermal mass and good heat conducting properties. The lid 120 has one or more feet 124, a lid top side 121, and a lid bottom side 129. The feet 124 protrude from the lid bottom side 129 on the periphery of the lid bottom side 129. The feet 124 can be individual or can surround the lid bottom side 129 around the periphery of the lid bottom side 129 in a continuous fashion. The feet 124 are structurally attached to the chip carrier 110 by lid adhesive 125. The lid bottom side 129 and feet 124 form a chip region 122 in which the chips 150 reside when the lid 120 is disposed on and connected to 125 the chip carrier 110. The chips 150 are in thermal contact with the lid bottom side 129 as described below.

A metalized layer 157 is disposed on one or more of the hot spots 156 on the backside 155 of the chip 150. The metalized layer 157 enables good adhesion for the higher performance TIMs 160. The metallized layer 157 is made of successive layers of materials such as chromium (Cr), Titanium (Ti), copper (Cu), nickel (Ni) and gold (Au). These layers enable wetting of the higher performance TIM layer 160 or act as diffusion barriers or passivation layers. The thickness of these layers may range from 3 Angstroms to 3 micrometers. The metalized layer is deposited by known techniques including plating, chemical vapor deposition (CVD), physical vapor deposition (PVD), plasma enhanced CVD, atomic layer deposition (ALD), evaporation, chemical solution deposition, or like processes.

A high-performance thermal interface material (TIM) 160 is disposed on the metallized layers 157. In some embodiments, the higher performance TIM 160 is a metal, e.g. a solder like Indium, Tin-silver, Lead-Tin, etc. In some embodiments, the thickness of the higher performance TIM 160 is between 25 to 300 microns. In some embodiments, the metal TIM may be a preform or a wire.

The metallized layer 157 and the higher performance TIM 160 can be any shape and any number on the chip 150 backside 155.

The lid 120 underside 129 is also metallized 127 to form one or more metallized lid locations 127 with similar materials and using similar methods as used for the metallized layer 157. The metallized lid locations 127 are positioned on the lid 120 underside 129 so that the metallized lid locations 127 are in contact with the metallized layers 157 through the higher performance TIM 160 when the lid 120 is positioned over and attached to 125 the chip carrier 110 during package assembly.

A lower performance TIM 170 is disposed within and fills the chip region 122 and surrounds the higher performance TIM 160. In some embodiments, the lower performance TIM 170 is a thermal pad typically made of silicone or other materials, a compressible pad, a compressible sheet, or a polymer in paste or gel form, or a liquid metal such as Indium-Gallium.

As stated, the package 100 has the lid 120 attached to the chip carrier 110 with lid adhesive 125 with the chips 150 and other package 100 circuitry within the chip region 122. The lid 120 bottom side 129 is in physical contact with the lower performance TIM 170 which is in turn in physical contact with the chip 150 backside 155 thus forming a thermal pathway for the conduction of heat from the chip 150 through the lower performance TIM 170 to the lid 120. In addition, other thermal pathways are formed from the chip 150 through the metallized layers 157, through the higher performance TIM 160, and to the metallized lid locations 127. Thus the entire backside 155 of the chip 150 is in thermal contact with the lid 120 through different pathways and combinations of TIMs where the pathway from the chip 150 hot spot 156 to the lid 120 has the higher performance TIM 160 in the respective pathway (157, 160, 127).

Figure 2:
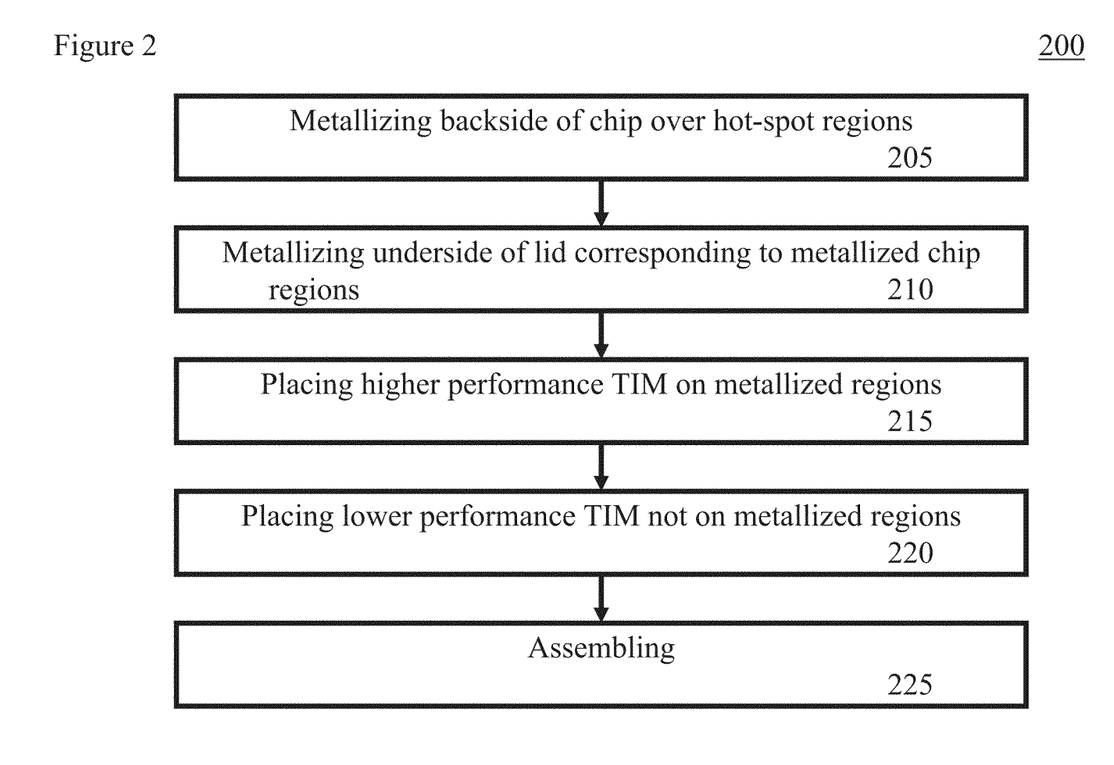
FIG. 2 is a flow chart showing the steps of one method for forming a semiconductor package using a combination of TIMs.

FIG. 2 is a flow chart showing the steps of one method 200 for forming a semiconductor package, e.g. 100, using a combination of solid TIMs (160, 170).

The method 200 begins with the step 205 of selectively metallizing the backside 155 of one or more of the chips 150 in the package, e.g. 100, to dispose the metallized layer 157 on the chip 150 hot spots 156 to form the metallized layers 157 as described above.

In step 210 the underside 129 of the lid 120 is selectively metalized 127 to form metalized lid locations 127. The metalized lid locations 127 are selectively positioned on the lid 120 underside 129 to be in contact with a corresponding higher performance TIM 160 on a metallized layer 157 when the lid 120 is assembled into the package, e.g. 100.

In step 215 the solid higher performance TIM 160 is placed on the metallized hot spot layers 157 by one of several methods as described below.

In step 220 the solid lower performance TIM 170 is disposed using one of the methods described below to place the lower performance TIM 170 between the backside 155 of the chip(s) 150 and the underside 129 of the lid 120 within the chip region 122 and surrounding the thermal pathways (157, 160, 127) formed over the chip 150 hot spots 156.

Step 225 is the assembling 225 of the lid 120 over the back side 155 of the chip 150 to create an assembly, e.g. 100, so that metalized lid locations 127 are in (physical and thermal) contact with the higher performance TIMs 160 and hot spots 156, respectively, and the feet 124 are physically connected 125 to the chip carrier 110 with a lid adhesive 125. This forms the chip region 122. In some embodiments, the assembly is cured and/or heated to between 105 to 225 Celsius for a time period of 1 to 4 hours to melt the higher performance TIM 160 and fuse the higher performance TIM 160 to the metallized layers 157 and metalized lid locations 127.

It is noted that in different embodiments, the steps of the method 200 can be performed in a different order and/or in parallel. For example, the forming 210 of the metallized lid locations 127 can be performed in parallel with the forming 205 of the metallized layers 157. The order of the placing 210 of the solid higher performance TIM 160 and placing 220 of the solid lower performance TIM 170 can be reversed. In addition, the placing 220 of the lower performance TIM 170 can be performed after the assembly step 225. See description below.

Figure 3:
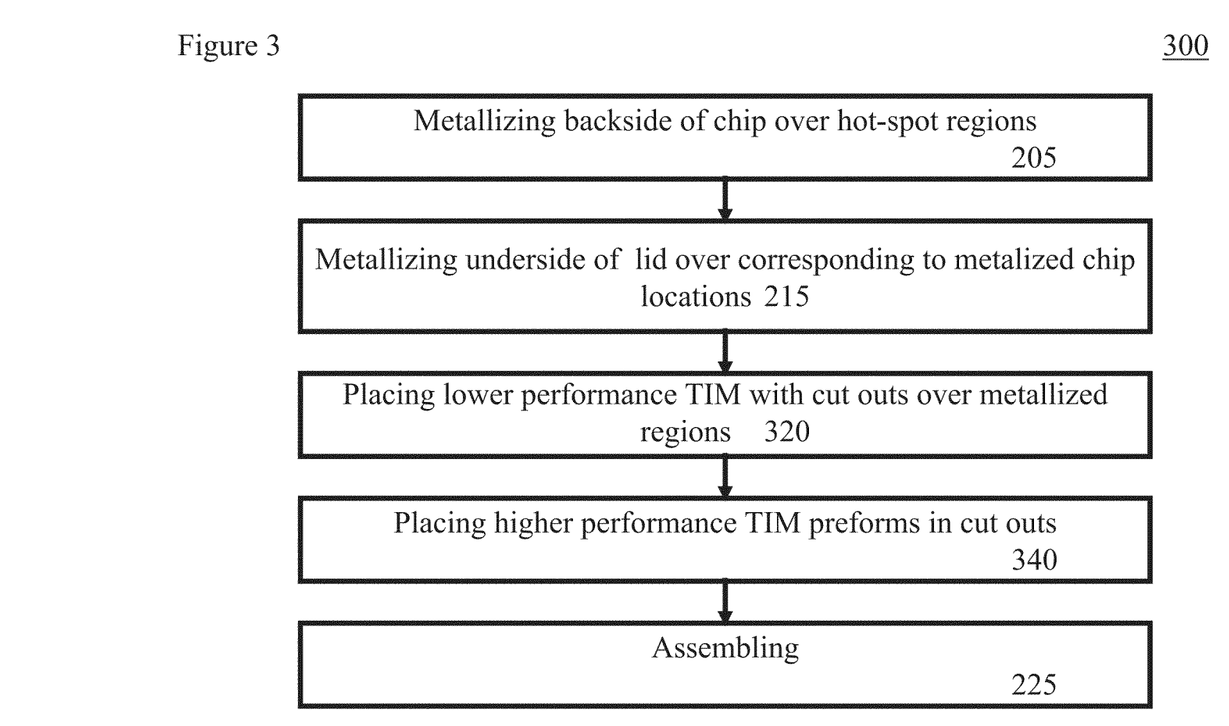
FIG. 3 is a flow chart showing the steps of one alternative method for forming a semiconductor package using a combination of TIMs including a lower performance TIM with cut outs on hot spots.

FIG. 3 is a flow chart showing the steps of one alternative method 300 for forming a semiconductor package, e.g. 100, using a combination of solid TIMs (160, 170) and using a lower performance TIM 170 such as a thermal pad in solid form, with cut outs 470. See also FIG. 4, a structure 400 showing a step of forming the combination of solid TIMs using the method 300 of FIG. 3.

The process 300 begins with step 205 which is the selective metallizing the backside 155 of one or more of the chips 150 in the package, e.g. 100, to form the metallized layers 157, as described above. The metallized layers are made only over the cutout regions (see step 320 below) in the solid lower performance TIM 470.

Step 215 is performed to selectively metalize the id locations 127, as described above.

Figure 4:
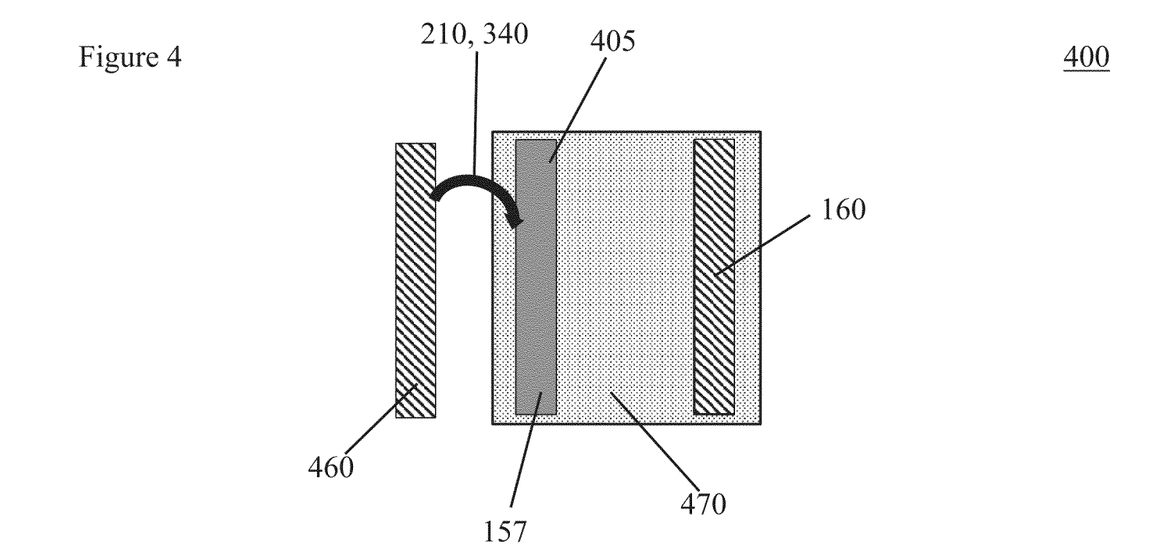
FIG. 4 is a structure showing a step of forming the combination of TIMs using the method of FIG. 3.

In step 320, a solid lower performance TIM (170, 470) pad or sheet (170, 470) with cutouts 405 is placed on the backside 155 of the chip 150. The cutouts in the sheet 470 expose the metallized layers 157 over the chip 150 hot spots 156.

The cutouts in the solid TIM pads or sheets (170, 470) can easily be made by simple machining or cutting operations. The TIM pads (170, 470) can be the same size as the chip 150 or slightly larger. If the TIM pad (170, 470) is the same size as the chip 150, it is positioned on the chip with the chip edges used for alignment. If the TIM pad (170, 470) is larger, it can be aligned using fiducial marks on the chip carrier 110. An adhesive layer may be present on one or both sides of the TIM pad (170, 470).

Step 340 places a preformed solid layer of higher performance TIM (160, 460) into the cutout 405.

The solid preforms for the higher performance TIM (160, 460) are made by machining or cutting methods or by melting the higher performance into the required shape. Dependent on their relative compressibility, the initial thickness of the higher and lower performance TIMs can be different.

In another embodiment, there are no metallization layers on the chip or lid. The higher-performance TIM (160, 460) has a pattern that compresses under the force used during package assembly.

Step 225 assembles the package 100, as before.

Figure 5:
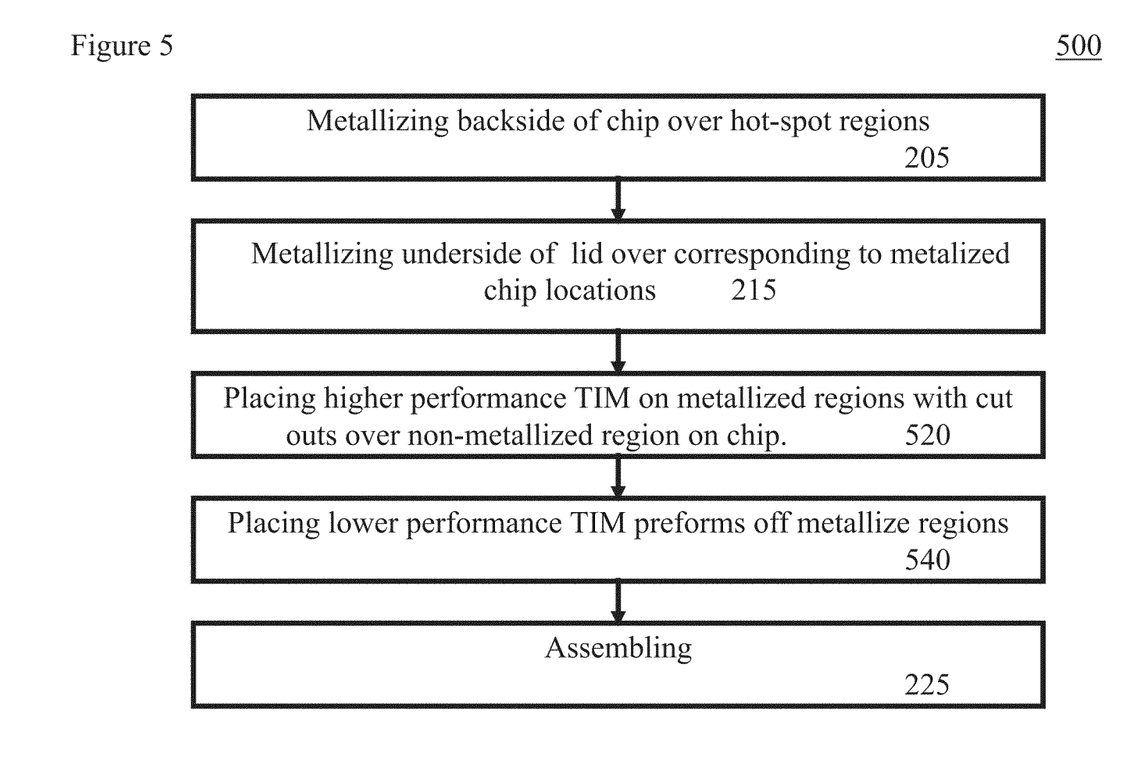
FIG. 5 is a flow chart showing the steps of one variation of another alternative method for forming a semiconductor package using a combination of TIMs by first placing a higher performance TIM on metallized hot spots.

FIG. 5 is a flow chart showing the steps of one variation of another alternative method 500 for forming a semiconductor package, e.g. 100, using a combination of TIMs (160, 170) by first placing a solid, higher performance TIM 160 on the metallized hot spot layers 157. See also FIG. 6, a structure during a step of forming of the combination of TIMs (160, 170) using the method 500 of FIG. 5, This method 500 reverses the order of the placing of the solid, higher performance TIM 160 and solid, lower performance TIM 170 as done in method 300.

The process 500 begins with step 205, selectively metallizing the backside 155 of one or more of the chips 150 to form 205 the metallized layers 157 over the chip 150 hot spots 156, as described above.

Step 215 is performed to selectively meta the lid locations 127, as described above.

Step 520 places the solid, higher performance TIM 160 on the metallized layers 157. In one embodiment, a solid preform 460 of the higher performance TIM 160 is placed on the metallized layer 157.

Heat is optionally applied at step 520 to fuse the solid, higher performance TIM 160 to the metallized layers 157. If heat is not applied in this step, it is applied later in the assembly.

Figure 6:
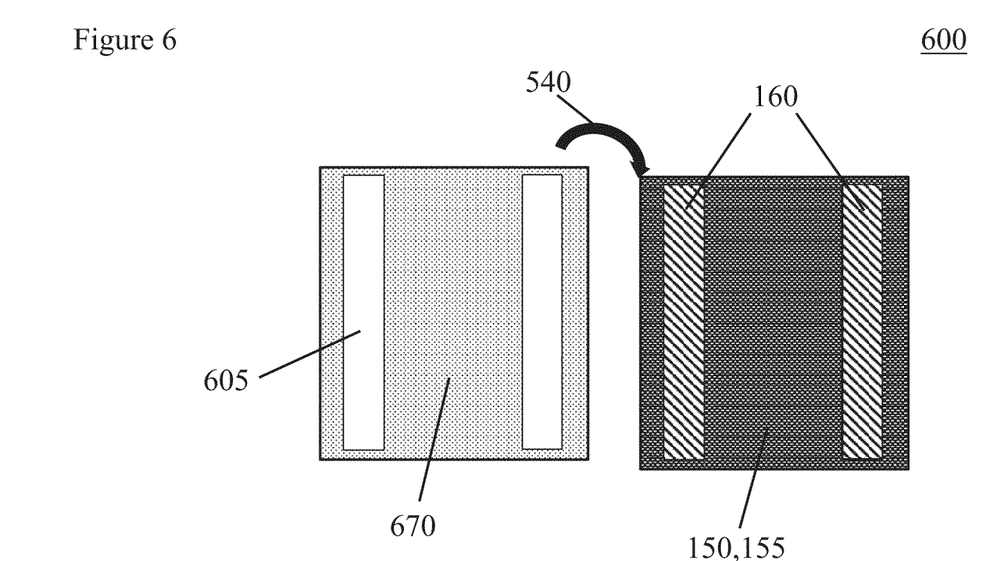
FIG. 6 is a structure showing a step of forming of the combination of TIMs using the method of FIG. 5.

Step 540 places the solid, lower performing TIM (170, 670) on the backside 155 of the chip 150 so the solid, lower performance TIM (170, 670) surrounds the solid, higher performance UM 160 and metallized hot spot layer 157 on the hot spots 156 of the chip 150. In one embodiment, a sheet 670 with cutouts 605 is placed over the backside 155 of the chip 150 so that the higher performance TIM 160 passes through the cutouts 605 in the respective metallized hot spot layer 157 locations.

As described below, there are alternative methods to perform this step 540. These examples use dispensable TIMs, e.g. TIMs that flow at room temperature.

Figure 7:
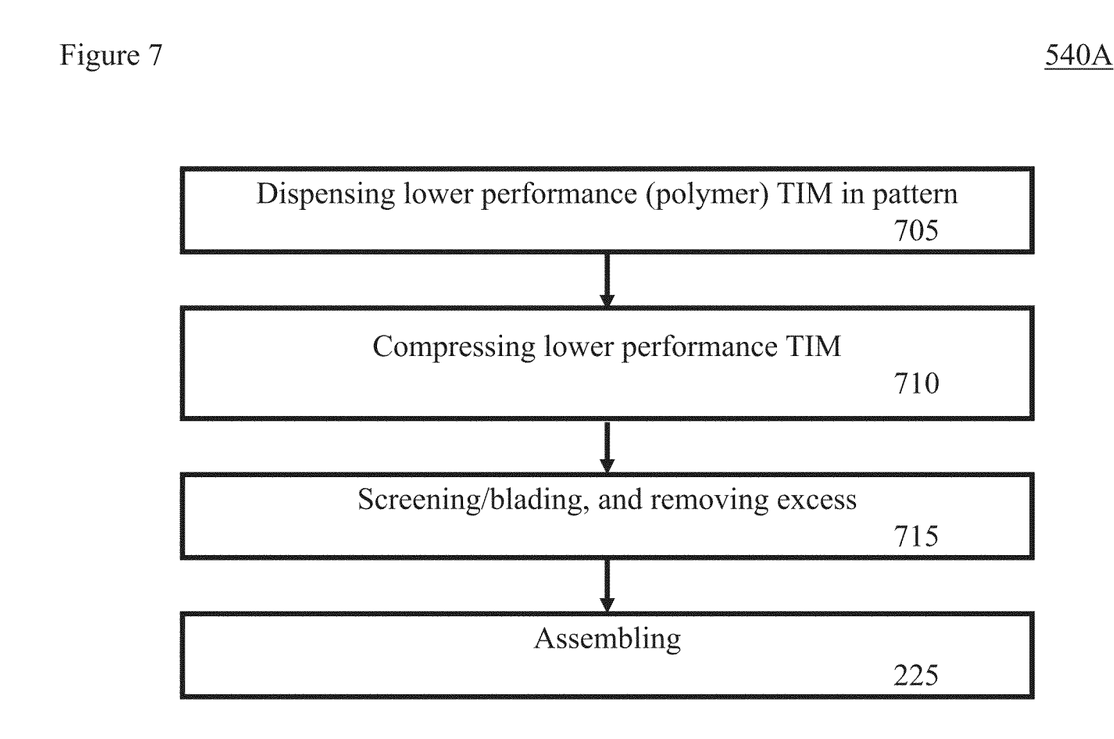
FIG. 7 is a flow chart showing the steps of a variation of the method in FIG. 5.

FIG. 7 is a flow chart showing the steps of a variation of step 540 in the method 500 in FIG. 5.

The variation of step 540A begins with the step 705 of dispensing 705 the dispensable, lower performance TIM in a pattern on the backside 155 of the chip 150 around the higher performance TIM 160 and metallized hot spot layer 157 on the hot spots 156 of the chip 150. In some embodiments, the lower performance TIM 170 is a polymer that can be poured or flowed onto the backside 155.

The dispense pattern may be a cross, star, serpentine or a Hershey-kiss type. The dispensable TIM may be a metal filled polymer in paste form. Multiple metal fillers may be used. Dispensing can be done manually using a syringe or using a positive displacement pump.

In step 710, the lower performance UM 170 is compressed to fill any open gaps in the chip region 122 between the chip 150 backside 155 and the lid bottom side 129. The compression can be done by using a compression fixture or in a universal load-displacement testing machine.

In step 715 excess lower performance TIM 170 is removed by known methods like running a blade across the structure to retain the lower performance TIM 170 within the chip region 122 and to keep the lower performance TIM 170 off the surface of the higher performance TIM 160 so the higher performance TIM 160 is clean for the assembly 225.

Step 225 assembles 225 the package, e.g. 100, as before.

Figure 8A:
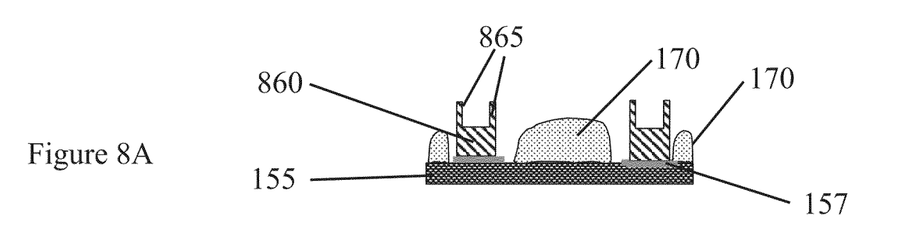
FIG. 8A is a cross section view of a structure used in a step in an alternative variation of the method of FIGS. 5 and 9.

FIG. 8A is a cross section view of a structure used in a step in an alternative variation of the step 540 of method 500 of FIG. 5 using dispensable, lower performance TIM 170. See the method 540B described in FIG. 9 as well.

FIG. 8A shows the backside 155 of the chip 150 with metallized hot spot layers 157. In this embodiment, the higher performance TIM 860 is shaped as a layer with thin rail structures 865 on top of the higher performance TIM 860. The thin rail structure 860 is placed 910 on the metallized hot spot layers 157.

Figure 9:
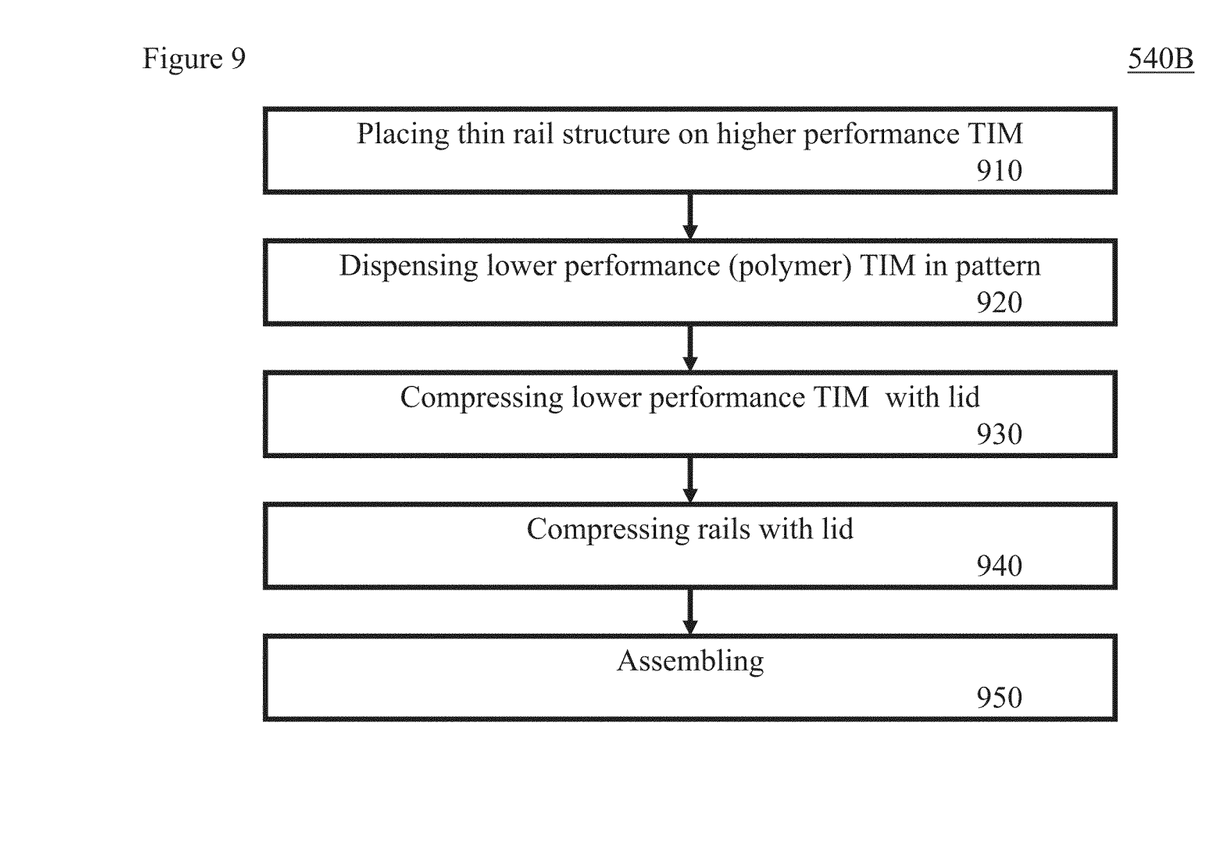
FIG. 9 is a flow chart showing the steps resulting in the structures in the alternative variation shown in FIGS. 8A, 8B, and 8C.

In step 920 of method 540B, the dispensable, lower performance TIM 170 is dispensed 920 on the chip 150 backside around the metallized hot spot layers 157 and thin rail structures of the higher performance TIM (860, 865). In some embodiments, the lower performance TIM 170 is a polymer.

Figure 8B:
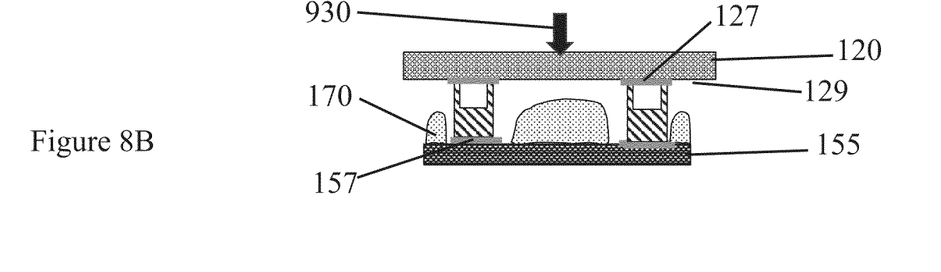
FIG. 8B is a cross section view of a structure used in a step in the alternative variation of the method of FIGS. 5 and 9.

FIG. 8B is a cross section view of a structure made in a next step 930 in the alternative variation 540B of the method 500 of FIG. 5.

In FIG. 8B the lid 120 is placed with the lid bottom side 129 facing the backside 155 of the chip 150. Pressure is applied 930 to the lid 120 compressing 930 the thin rail structures 865 and compressing 930 the dispensable, lower performance TIM 170 to remove voids and surround the higher performance TIMs 860. The thin rails bend due to the compression pressure and enter the lower thermal performance TIM region.

Figure 8C:
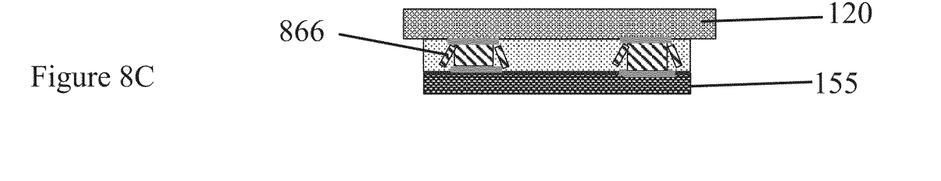
FIG. 8C is a cross section view of a structure used in a final step in the alternative variation of the method of FIGS. 5 and 9.

FIG. 8C is a cross section view of a structure formed in a final step 940 in the alternative variation 540B of the method 500 of FIG. 5. This structure shows the thin rail structures 865 bent 866 into the lower performance TIM area. The dispensable, lower performance TIM 170 is prevented from spilling onto the surface of the higher performance TIM 860 to permit good curing/bonding. In this embodiment, the thin rail structures 865 are bent 866 below the surface of the higher performance TIM 860 to permit better contact with the metallized lid locations 127.

In step 950 during assembly, the structure is cured/heated at a temperature between 105 and 225 degrees Celsius for a period between 1 and 4 hours to flow the higher performance TIM 860 to bond with the metallization hot spot layers 157 and the metallized lid locations 127.

Figure 10A:
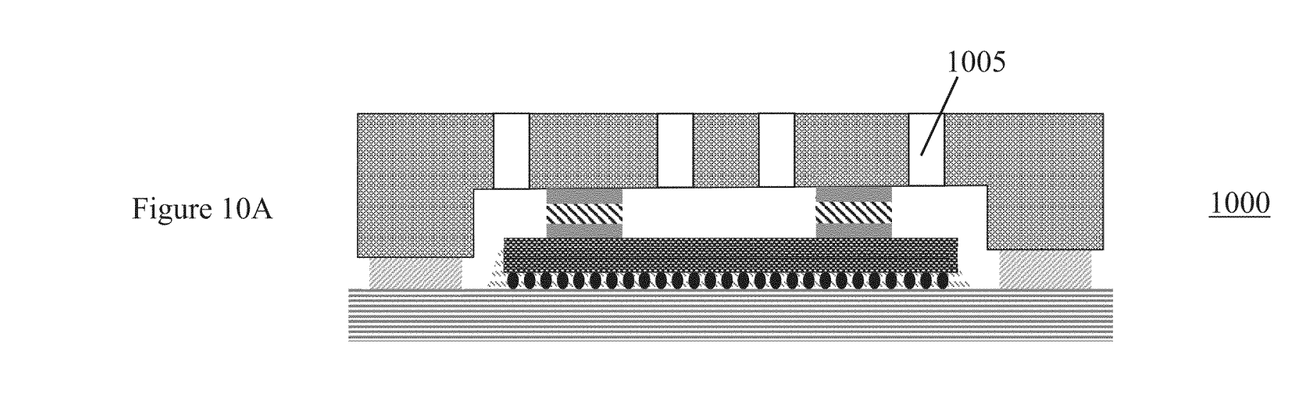
FIG. 10A is a cross section view of a package structure with injection holes in the lid.

FIG. 10A is a cross section view of a package structure 1000 with injection holes 1005 in the lid 120. The injection holes 1005 can be put into the lid 120 using standard methods, e.g. drilling or pre-forming the injection holes 1005 in a molding process. The injection holes 1005 open the chip region 122 to the outside of the package, e.g. 100. The injection holes 1005 have a large enough cross section area to allow injection of the lower performance TIM 170 through them.

In this embodiment, the package is assembled 225 prior to placing of the lower performance TIM (320, 540).

Figure 10B:
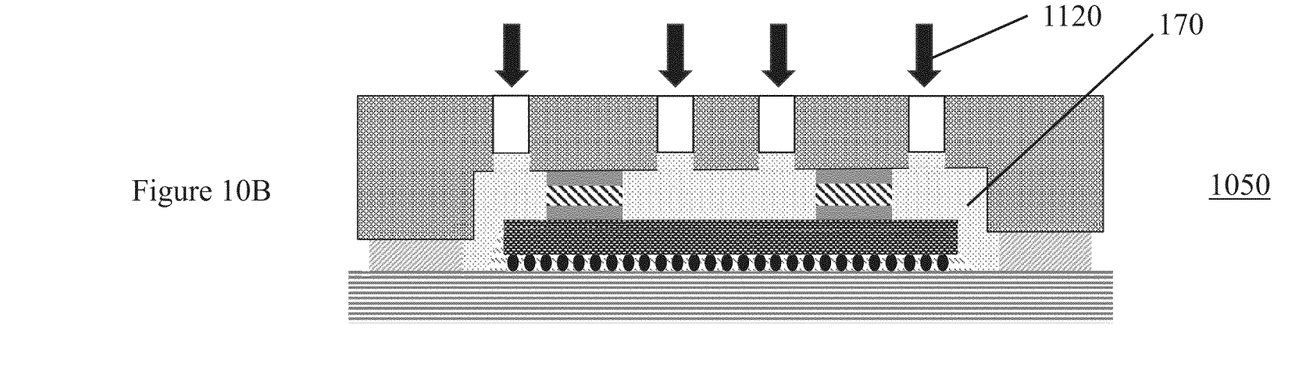
FIG. 10B is a cross section view of a package structure with a lower performance TIM injected into the package structure through the injection holes.

FIG. 10B is a cross section view of a package structure 1050 with a dispensable, lower performance TIM 170 being injected 1120 into the package structure 1050 through the injection holes 1005.

Figure 11:
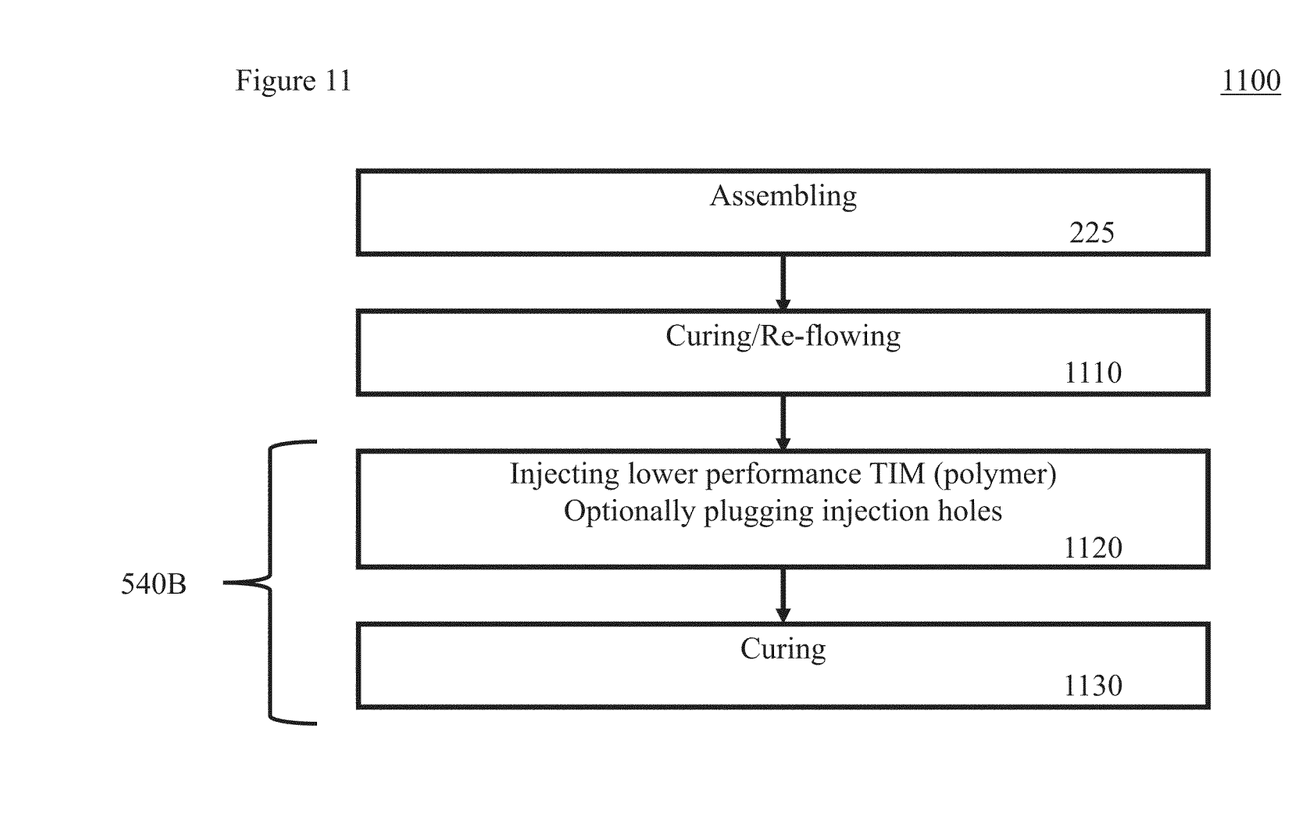
FIG. 11 is a flow chart showing the steps of post-injection curing of the lower performance TIM in FIG. 10B.

FIG. 11 is a flow chart showing the steps of a process 1100 of injecting 1120 the dispensable, lower performance TIM 170 in FIG. 10B.

In the process 1100, the assembling step 225 is performed first to create the structure 1000 with injection holes 1005 in the lid 120.

A curing/re-flowing step 1110 is performed to bond the higher performance TIM 160 to the metallization hot spot layers 157 and the metallized lid locations 127.

An alternative process 540B of placing the lower performance TIM 170 between the backside 155 of the chip 150 and the lid bottom side 129 is performed. The process 540B comprises the below two steps.

In step 1120, the dispensable, lower performance TIM 170 is injected into the chip region 122 through the injection holes 1005. In some embodiments, the lower performance TIM 170 is a polymer, a metal particle filled polymer paste, a ceramic particle filled polymer paste, grease, or gel TIM.

The injection 1120 can occur by disposing the dispensable, lower performance TIM 170 on the lid 120 under pressure thus forcing the lower performance TIM 170 through the injection holes 1005 into the chip region 122.

In an optional step 1120, a plugging material can be injected into the injection holes 1005 after the lower performance UM 170 is injected. The plugging material (not shown) can be cured in the next step 1130.

In some embodiments step 1130 is performed which cures the entire assembly 1150. The curing temperature is between 105 and 225 degrees Celsius for between 1 and 4 hours. The curing 1130 hardens the lower performance TIM 170 and sets it in place. In some embodiments, the injection holes may be covered with a cured epoxy during the curing step 1130 or by using a UV-cure epoxy after the curing step 1130.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming a thermal interface comprising the steps of:
   selectively metallizing a backside of a semiconductor chip (chip) to form one or more metallized layers on one or more hot spot regions of the chip, a connection side of the chip electrically and physically connected to a chip carrier by one or more electrical connections;
   selecting two or more thermal interface materials (TIMs), the TIMs being one of a higher performance TIM and a lower performance TIM, the higher performance TIM having a higher heat transfer coefficient than the lower performance TIM;
   placing a higher performance thermal interface material (TIM) on the metallized layers;
   selectively metalizing an underside of a lid in one or more metalized lid locations, each of the metalized lid locations corresponding to one of the high-performance TIMs, the lid having one or more feet protruding from the underside of the lid to create a chip region on the underside of the lid; and
   assembling the lid over the backside of the chip to create an assembly so that metalized lid locations are in contact with the higher performance TIMs, respectively, a lower performance TIM being between the backside of the chip and the lid where there is no higher performance TIMs, and the feet being in contact with chip carrier with a lid adhesive between the feet and chip carrier.

2. A method, as in claim 1, further comprising the step of injecting the lower performance TIM into the chip region through injection holes in the lid after assembling the lid.

3. A method, as in claim 1, further comprising the step of placing the lower performance TIM on the backside of the chip prior to assembling the lid.

4. A method, as in claim 3, where the lower performance TIM is placed between backside of the chip and the lid by performing the following steps:
   dispensing the lower performance TIM on the backside of the chip;
   compressing the lower performance TIM to fill one or more volume spaces above the backside of the chip; and
   blading the lower performance TIM to remove the lower performance TIM from the higher performance TIM.

5. A method, as in claim 3, where the higher performance TIMs each comprise a rail structure and the lower performance TIM is placed between backside of the chip and the lid by performing the following steps:
   dispensing the lower performance TIM on the backside of the chip;
   dispensing the lid adhesive on one or more of the chip carrier and the foot of the lid; and
   forcing the lid on the rail structures to perform the steps of:
      compressing the lower performance TIM to fill one or more volume spaces above the backside of the chip;
      bending the rail structures to prevent the lower performance TIM from flowing on the higher performance TIM; and
      bending the rail structures so the top of the higher performance TIM is in contact with the metalized lid locations.

6. A method, as in claim 1, where a dispensable, lower performance TIM is one of the following materials: a polymer paste, a polymer gel, a polymer grease, a low viscosity grease, a liquid metal, and Indium-Gallium.

7. A method, as in claim 1, where the higher performance TIM is one or more of the following: a solder, Indium; Tin-silver, and Lead-Tin.

8. A method, as in claim 1, further comprising the step of curing the thermal interface at between 105 and 225 degrees Celsius for between 1 and 4 hours.

9. A method as in claim 1, wherein the metallized layers are between 3 Angstroms and 3 micrometers thick.

10. A method, as in claim 1, wherein the lower performance TIM is disposed within and filling the chip region and surrounding the higher performance TIM.

11. A method as in claim 1, wherein the higher performance Tim has a higher performance TIM thickness between 25 microns to 300 microns.

12. A method, as in claim 1, wherein the higher performance TIM is a metal TIM including a metal preform and a wire.

13. A method as in claim 1, wherein the metallized layers on one or more hot spot regions of the chip are made of successive layers of materials such as chromium (Cr), Titanium (Ti), copper (Cu), nickel (Ni) and gold (Au).

14. A method of forming a heat conductive combination of thermal interface materials (TIMs) comprising the steps of:
   selectively metallizing a backside of a semiconductor chip (chip) to form one or more metallized layers, each metallized layer over a hot spot of the chip, a connection side of the chip electrically and physically connected to a chip carrier by one or more electrical connections;

selecting two or more thermal interface materials (TIMs) the TIMs being one of a higher performance TIM and a lower performance TIM, the higher performance TIM having a higher heat transfer coefficient than the lower performance TIM;

placing the higher performance TIM on the metallized hot spots and the lower performance TIM on the backside of the chip not on the metallized hot spot by:

patterning a first solid TIM material, being the lower performance TIM, over the back side of the chip, the first solid TIM material having one or more cut outs, the cut outs being positioned over one or more first regions of the chip so that the first regions are not covered by the first solid TIM material;

placing a pre-formed shape of second solid TIM material, being the higher performance TIM, into each of one or more of the cut outs, the pre-formed shape of the second solid TIM material filling the respective cut out;

selectively metalizing an underside of a lid in one or more metalized lid locations, each of the metalized lid locations corresponding to one of the hot spots on the chip, the lid having one or more feet protruding from the underside of the lid to create a chip region on the underside of the lid; and assembling the lid over the back side of the chip so that metalized lid locations are in thermal contact with the hot spots, respectively, and the feet are in contact with chip carrier with a lid adhesive between to create an assembly.

15. A method, as in claim 14, where the first region is over the hot spots.

16. A method, as in claim 15, where the higher performance TIM is one of the following: a solder, Indium, Tin-silver, and Lead-Tin.

17. A method, as in claim 15, where the lower performance TIM is one of the following: a silicone, a polymer in paste form, a polymer in a gel form, a polymer grease, a low viscosity grease, a liquid metal, a compressible pad, a compressible sheet, and Indium-Gallium.

18. A method, as in claim 14, where the first solid TIM material is the lower performance TIM, the first region is not over the hot spots, and the second solid TIM material is the higher performance TIM.

19. A method, as in claim 14, where the assembly is cured to reflow at least one of the high performance TIM and low performance TIM before assembling the lid.

20. A method, as in claim 14, where the assembly is cured to reflow the high-performance TIM after assembling the lid.

* * * * *